United States Patent
Zhao et al.

(10) Patent No.: US 12,112,712 B2
(45) Date of Patent: Oct. 8, 2024

(54) BACKLIGHT DRIVING BOARD, BACKLIGHT MODULE, DISPLAY APPARATUS AND METHOD FOR ADJUSTING BRIGHTNESS AND COLOR TEMPERATURE THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Lijin Zhao, Beijing (CN); Yu Zhang, Beijing (CN); Shixin Geng, Beijing (CN); Guangyun Tong, Beijing (CN); Zhuolong Li, Beijing (CN); Miao Liu, Beijing (CN); Huiyan Li, Beijing (CN); Fan Yang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 268 days.

(21) Appl. No.: 17/638,780

(22) PCT Filed: Apr. 8, 2021

(86) PCT No.: PCT/CN2021/086026
§ 371 (c)(1),
(2) Date: Feb. 25, 2022

(87) PCT Pub. No.: WO2021/223564
PCT Pub. Date: Nov. 11, 2021

(65) Prior Publication Data
US 2022/0277698 A1 Sep. 1, 2022

(30) Foreign Application Priority Data
May 8, 2020 (CN) .......................... 202010383454.7

(51) Int. Cl.
*G09G 3/34* (2006.01)
*G09G 3/36* (2006.01)
*H05K 1/14* (2006.01)

(52) U.S. Cl.
CPC ......... *G09G 3/3413* (2013.01); *G09G 3/3426* (2013.01); *G09G 3/3648* (2013.01);
(Continued)

(58) Field of Classification Search
CPC .. G09G 3/3413; G09G 3/3426; G09G 3/3648; G09G 2310/08; G09G 2320/064;
(Continued)

(56) References Cited

U.S. PATENT DOCUMENTS

| | | | |
|---|---|---|---|
| 2007/0182682 A1* | 8/2007 | Hong .................. | G09G 3/3413 345/88 |
| 2009/0152445 A1* | 6/2009 | Gardner, Jr. ......... | G09G 3/3406 250/214 AL |

(Continued)

FOREIGN PATENT DOCUMENTS

| | | |
|---|---|---|
| CN | 101290744 A | 10/2008 |
| CN | 101399032 A | 4/2009 |

(Continued)

OTHER PUBLICATIONS

The First Office Action for Chinese Patent Application No. 202010383454.7 issued by the Chinese Intellectual Property Office on Dec. 25, 2020.

(Continued)

*Primary Examiner* — Kwang-Su Yang
(74) *Attorney, Agent, or Firm* — IP & T GROUP LLP (57) ABSTRACT

A backlight driving board includes a main circuit board, and a photosensitive device, a backlight controller and a first port that are disposed on the main circuit board. The photosensitive device is configured to sense brightness and color (Continued)

temperature of a light source, and output brightness data and color temperature data. The backlight controller is coupled to the photosensitive device, and configured to receive the brightness data and adjust light-emitting brightness of the light source according to the brightness data. The first port is coupled to the photosensitive device, and configured to be coupled to a system board, receive the color temperature data, and transmit the color temperature data to the system board, such that the system board adjusts color temperature of a picture displayed by a display panel according to the color temperature data.

18 Claims, 7 Drawing Sheets

(52) U.S. Cl.
CPC ......... H05K 1/141 (2013.01); *G09G 2310/08* (2013.01); *G09G 2320/064* (2013.01); *G09G 2320/0666* (2013.01); *G09G 2360/16* (2013.01); *H05K 2201/10136* (2013.01)

(58) Field of Classification Search
CPC ....... G09G 2320/0666; G09G 2360/16; H05K 1/141; H05K 2201/10136
See application file for complete search history.

(56) References Cited

U.S. PATENT DOCUMENTS

| | | | |
|---|---|---|---|
| 2010/0052564 A1 | 3/2010 | Park et al. | |
| 2010/0289811 A1 | 11/2010 | Chen et al. | |
| 2014/0049527 A1* | 2/2014 | Lanzoni | G09G 3/3406 345/207 |
| 2018/0144691 A1 | 5/2018 | Choi et al. | |
| 2019/0130852 A1 | 5/2019 | Liao et al. | |
| 2020/0135146 A1* | 4/2020 | Lee | G09G 5/10 |
| 2021/0364861 A1* | 11/2021 | Lum | H05B 47/105 |
| 2022/0005439 A1 | 1/2022 | Hu et al. | |

FOREIGN PATENT DOCUMENTS

| | | |
|---|---|---|
| CN | 101660692 A | 3/2010 |
| CN | 101833928 A | 9/2010 |
| CN | 102568407 A | 7/2012 |
| CN | 102568407 B | 7/2013 |
| CN | 107808641 A | 3/2018 |
| CN | 108428438 A | 8/2018 |
| CN | 109683363 A | 4/2019 |
| CN | 110021256 A | 7/2019 |
| CN | 110967862 A | 4/2020 |
| CN | 111445870 A | 7/2020 |
| WO | 2019/017959 A1 | 1/2019 |

OTHER PUBLICATIONS

The Second Office Action for Chinese Patent Application No. 202010383454.7 issued by the Chinese Intellectual Property Office on Jul. 1, 2021.

Notification to Grant Patent Right for Invention for Chinese Patent Application No. 202010383454.7 issued by the Chinese Intellectual Property Office on Nov. 17, 2021.

* cited by examiner

BACKLIGHT DRIVING BOARD, BACKLIGHT MODULE, DISPLAY APPARATUS AND METHOD FOR ADJUSTING BRIGHTNESS AND COLOR TEMPERATURE THEREOF

CROSS-REFERENCE TO RELATED APPLICATIONS

This application is a national phase entry under 35 USC 371 of International Patent Application No. PCT/CN2021/086026 filed on Apr. 8, 2021, which claims priority to Chinese Patent Application No. 202010383454.7, filed on May 8, 2020, which are incorporated herein by reference in their entirety.

TECHNICAL FIELD

The present disclosure relates to the field of display technologies, and in particular, to a backlight driving board, a backlight module, a display apparatus and a method for adjusting a brightness and a color temperature thereof.

BACKGROUND

The brightness and color temperature of a light source of a backlight module in a liquid crystal display apparatus will be attenuated to a certain extent after long-term use (generally more than 30,000 hours), causing pictures displayed by the display apparatus to appear dark and yellowish. However, since there isn't a monitoring and feedback mechanism for the light source in the liquid crystal display apparatus, the light source and the displayed pictures cannot be adjusted. Consequently, the display effect of the display apparatus will become worse and worse over time.

SUMMARY

In one aspect, a backlight driving board is provided. The backlight driving board includes a main circuit board, a photosensitive device, a backlight controller and a first port. The photosensitive device is disposed on the main circuit board; and the photosensitive device is configured to sense a brightness and a color temperature of a light source, and output brightness data and color temperature data. The backlight controller is disposed on the main circuit board; and the backlight controller is coupled to the photosensitive device, and configured to receive the brightness data, and adjust a light-emitting brightness of the light source according to the brightness data. The first port is disposed on the main circuit board; and the first port is coupled to the photosensitive device, and configured to be coupled to a system board, receive the color temperature data, and transmit the color temperature data to the system board, such that the system board adjusts a color temperature of a picture displayed by a display panel according to the color temperature data.

In some embodiments, the photosensitive device is integrated on the main circuit board.

In some embodiments, the main circuit board includes a first main surface and a second main surface opposite to each other. The first main surface is configured to be proximate to the light source. The photosensitive device is disposed on the first main surface of the main circuit board.

In some embodiments, the backlight driving board further includes an auxiliary circuit board. The auxiliary circuit board and the main circuit board are capable of transmitting data to each other. The photosensitive device is disposed on the main circuit board through the auxiliary circuit board.

In some embodiments, the main circuit board includes a first main surface and a second main surface opposite to each other, and the first main surface is configured to be proximate to the light source. The auxiliary circuit board includes a fixed portion and an extending portion. The fixed portion is fixed to the second main surface of the main circuit board, and the extending portion extends beyond an edge of the second main surface of the main circuit board. The photosensitive device is disposed on a side, proximate to a plane where the first main surface of the main circuit board is located, of the extending portion of the auxiliary circuit board.

In some embodiments, the backlight driving board further includes a second port and a third port. The second port is disposed on the auxiliary circuit board; and the photosensitive device is couple to the second port. The third port is disposed on the main circuit board; and the third port is coupled to the second port, the backlight controller and the first port.

In some embodiments, the backlight driving board further includes a terminal line. The second port is coupled to the third port through the terminal line.

In some embodiments, the photosensitive device includes a sensing element and a chip. The sensing element is configured to sense a light-emitting state of the light source, and output sensing data. The chip is coupled to the sensing element; and the chip is configured to process the sensing data, and output the brightness data and the color temperature data.

In some embodiments, the photosensitive device is an ambient light sensor.

In some embodiments, the backlight controller is configured to output a brightness adjustment signal according to the brightness data. The backlight driving board further includes a light source driver and a fourth port that are disposed on the main circuit board. The light source driver is coupled to the backlight controller; and the light source driver is configured to receive the brightness adjustment signal, and adjust the light-emitting brightness of the light source according to the brightness adjustment signal. The fourth port is configured to couple the light source driver to the light source.

In another aspect, a backlight module is provided. The backlight module includes a backplane, the light source disposed on a side of the backplane, and the backlight driving board as described above. The backlight driving board is disposed on a side of the backplane away from the light source. The backplane has an opening at a position corresponding to the photosensitive device of the backlight driving board. A sensing end of the photosensitive device extends into the opening, so as to sense the brightness and the color temperature of the light source.

In still another aspect, a display apparatus is provided. The display apparatus includes the backlight module as described above, the display panel and the system board. The display panel is disposed on a light-exit surface of the backlight module. The system board is coupled to the first port of the backlight driving board in the backlight module, and the display panel. The system board is configured to receive the color temperature data from the first port, and adjust the color temperature of the picture displayed by the display panel according to the color temperature data.

In some embodiments, the system board is configured to adjust display data required for the display panel to display the picture according to the color temperature data, and output adjusted display data. The display apparatus further includes a timing controller. The system board is coupled to the display panel through the timing controller. The timing controller is configured to control the display panel to display the picture according to the adjusted display data.

In still another aspect, a method for adjusting the brightness and the color temperature of the display apparatus as described above is provided. The adjusting method includes: sensing, by the photosensitive device of the backlight driving board in the backlight module, the brightness and the color temperature of the light source of the backlight module; outputting, by the photosensitive device, the brightness data and the color temperature data; receiving, by the backlight controller of the backlight driving board, the brightness data; adjusting, by the backlight controller, the light-emitting brightness of the light source according to the brightness data; receiving, by the system board, the color temperature data; and adjusting, by the system board, the color temperature of the picture displayed by the display panel according to the color temperature data.

In some embodiments, the backlight driving board further includes a light source driver; receiving, by the backlight controller of the backlight driving board, the brightness data, and adjusting, by the backlight controller, the light-emitting brightness of the light source according to the brightness data, includes: receiving, by the backlight controller, the brightness data; outputting, by the backlight controller, a brightness adjustment signal according to the brightness data; receiving, by the light source driver, the brightness adjustment signal; and adjusting, by the light source driver, the light-emitting brightness of the light source according to the brightness adjustment signal.

In some embodiments, the display apparatus further includes a timing controller; receiving, by the system board, the color temperature data, and adjusting, by the system board, the color temperature of the picture displayed by the display panel according to the color temperature data, includes: receiving, by the system board, the color temperature data; adjusting, by the system board, display data required for the display panel to display the picture according to the color temperature data; outputting, by the system board, adjusted display data; and controlling, by the timing controller, the display panel to display the picture according to the adjusted display data.

In some embodiments, the photosensitive device includes a sensing element and a chip; sensing, by the photosensitive device of the backlight driving board in the backlight module, the brightness and the color temperature of the light source of the backlight module, and outputting, by the photosensitive device, the brightness data and the color temperature data, includes: sensing, by the sensing element, a light-emitting state of the light source; outputting, by the sensing element, sensing data; processing, by the chip, the sensing data; and outputting, by the chip, the brightness data and the color temperature data.

In some embodiments, processing, by the chip, the sensing data, and outputting, by the chip, the brightness data and the color temperature data, includes: obtaining, by the chip, XYZ data corresponding to the sensing data according to a coefficient matrix that characterizes a relationship between the RGB data and the XYZ data, where the sensing data is the RGB data, and the XYZ data is tristimulus values of RGB three primary colors; outputting, by the chip, a Y value of the XYZ data corresponding to the sensing data as the brightness data; obtaining, by the chip, color coordinates according to the XYZ data corresponding to the sensing data; calculating, by the chip, the color temperature data according to the color coordinates; and outputting, by the chip, the color temperature data.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The terms "coupled", "connected" and derivatives thereof may be used in describing some embodiments. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The use of "suitable for" or "configured to" herein indicates an open and inclusive expression, which does not exclude devices that are applicable to or configured to perform additional tasks or steps.

Some embodiments of the present disclosure provide a display apparatus 03. The display apparatus 03 may be any apparatus that displays images whether in motion (e.g., videos) or stationary (e.g., still images) and whether text or images. More specifically, it is anticipated that the embodiments may be implemented in a variety of electronic apparatuses or associated with a variety of electronic apparatuses. The variety of electronic apparatuses include (but are not limited to) mobile phones, wireless apparatuses, personal data assistants (PDAs), hand-held or portable computers, GPS receivers/navigators, cameras, MP4 video players, video cameras, game consoles, watches, clocks, calculators, television monitors, flat-panel displays, computer monitors, automobile displays (e.g., odometer displays, etc.), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

Figure 9A:
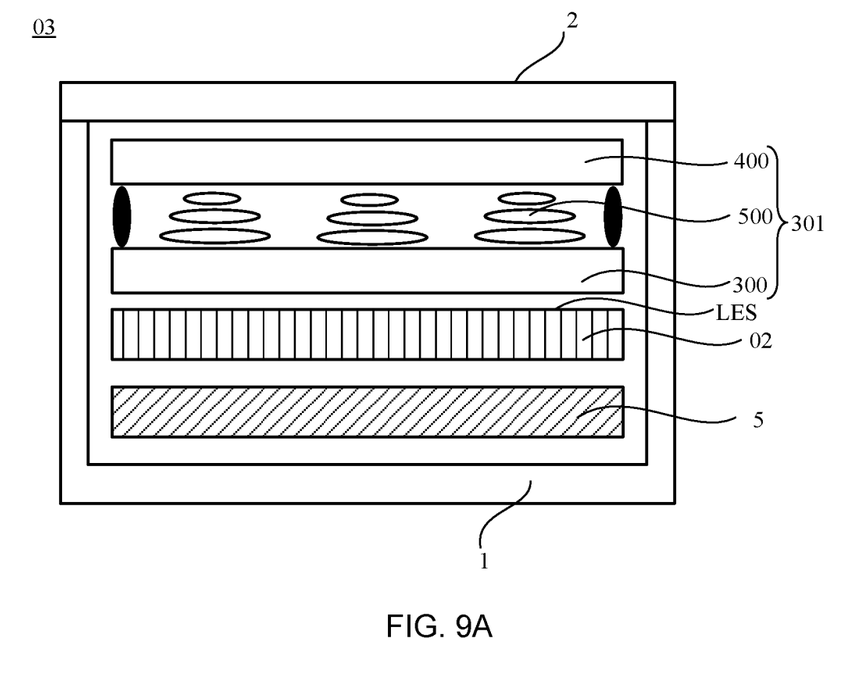
FIG. 9A is a structural diagram of a display apparatus, in accordance with some embodiments.

A display apparatus provided by embodiments of the present disclosure is a liquid crystal display apparatus. As shown in FIG. 9A, a main structure of the liquid crystal display apparatus 03 includes a frame 1, a cover plate 2, a display panel 301, a backlight module 02, a circuit board 5 and other electronic components. The display panel 301 includes an array substrate 300, an opposite substrate 400, and a liquid crystal layer 500 disposed between the array substrate 300 and the opposite substrate 400. The array substrate 300 and the opposite substrate 400 are assembled together by a frame sealant, so that the liquid crystal layer 500 is confined within a region enclosed by the frame sealant.

As shown in FIG. 9A, the display panel 301 is disposed on a light-exit surface LES of the backlight module 02. The backlight module 02 is configured to provide light for the display panel 301, so that the display panel 301 can perform display.

Figure 9B:
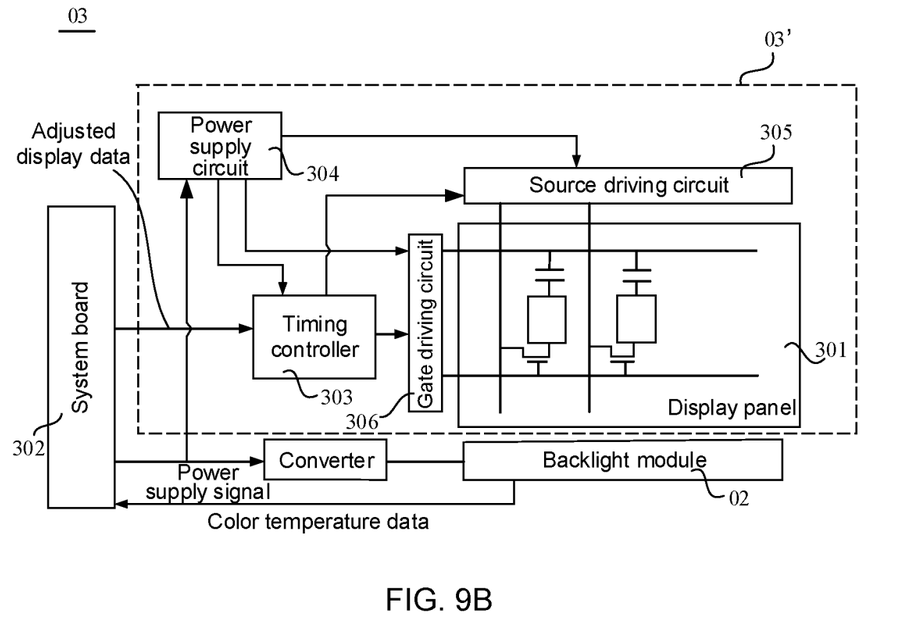
FIG. 9B is a circuit structural diagram of a display apparatus, in accordance with some embodiments.

As shown in FIG. 9B, the display apparatus 03 further includes a system board 302. The system board 302 is coupled to the display panel 301. The system board 302 is configured to output display data for controlling the display panel 301 to perform display, so as to control the display panel 301 to realize display.

In some embodiments, the display apparatus 03 further includes a timing controller 303 (TCON), a power supply circuit 304, a gate driving circuit 306 and a source driving circuit 305.

The system board 302 is coupled to the timing controller 303. The system board 302 is configured to output display data for controlling the display panel 301 to perform display. The timing controller 303 is configured to receive the display data output by the system board 302, and generate a control signal according to the received display data, so as to control the display panel 301 to realize display.

Specifically, the gate driving circuit 306 is coupled to the timing controller 303 and the display panel 301, and the source driving circuit 305 is coupled to the timing controller 303 and the display panel 301. The gate driving circuit 306 is configured to receive control signals of a gate driver output by the timing controller 303, generate scanning signals according to the received control signals, and output the scanning signals to the display panel 301. The source driving circuit 305 is configured to receive control signals of the source driver output by the timing controller 303, generate data signals according to the received control signals, and output the data signals to the display panel 301. In this way, the display panel 301 realizes display under joint action of the gate driving circuit 306 and the source driving circuit 305.

In the display apparatus 03, the power supply circuit 304 is coupled to the system board 302, the timing controller 303, the gate driving circuit 306 and the source driving circuit 305. Signals that are input from the system board 302 to a display module 03' (as shown in FIG. 9B, including the display panel 301, the timing controller 303, power supply circuit 304, source driving circuit 305, and gate driving circuit 306) include power supply signals and adjusted display data signals. The power supply signals are transmitted to the power supply circuit 304, so that the power supply circuit 304 generates power supply voltages required for operations of the gate driving circuit 306, the source driving circuit 305, the timing controller 303 and other circuits, so as to provide power for these circuits.

As shown in FIG. 9B, the system board 302 is further coupled to the backlight module 02. The backlight module 02 is configured to receive color temperature data from the backlight module 02, and adjust a color temperature of a picture displayed by the display panel 301 according to the color temperature data. Details regarding this will be provided later.

Figure 4:
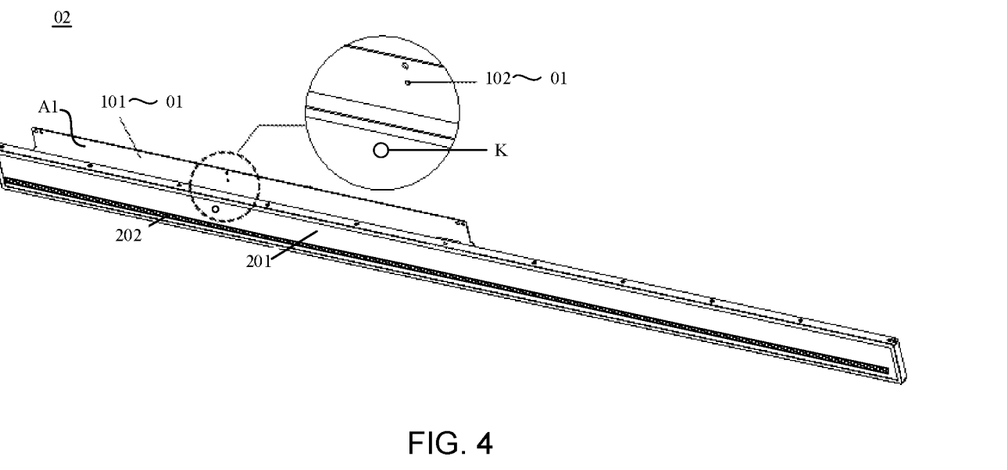
FIG. 4 is a structural diagram of a backlight module, in accordance with some embodiments.
Figure 5:
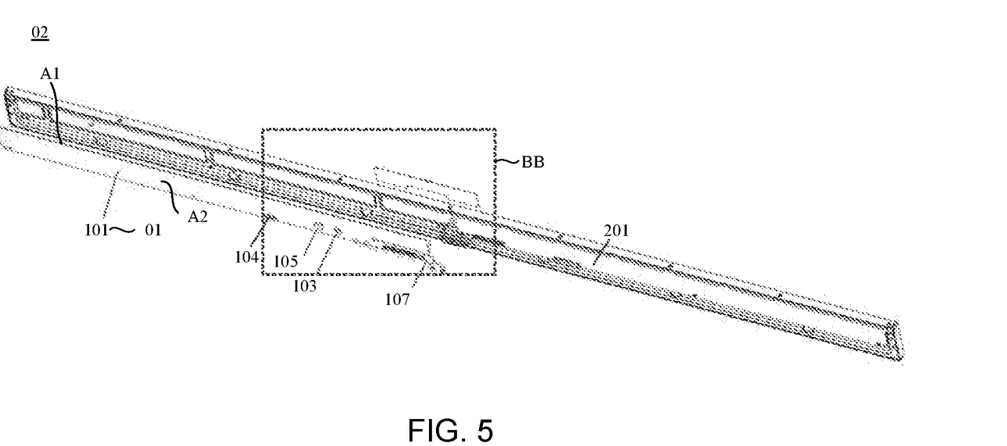
FIG. 5 is a structural diagram of another backlight module, in accordance with some embodiments.

As shown in FIGS. 4 and 5, some embodiments of the present disclosure provide the backlight module 02. The backlight module 02 includes a backplane 201, a light source 202 and a backlight driving board 01.

The light source 202 is disposed on a side of the backplane 201. The backlight driving board 01 is disposed on a side of the backplane 201 away from the light source 202. The backlight driving board 01 is configured to drive the light source 202 to emit light.

The backlight driving board 01 includes a photosensitive device 102. An opening K is provided in the backplane 201 at a position corresponding to the photosensitive device 102 of the backlight driving board 01. A sensing end of the photosensitive device 102 extends into the opening K, so as to sense a brightness and a color temperature of the light source 202.

Figure 1:
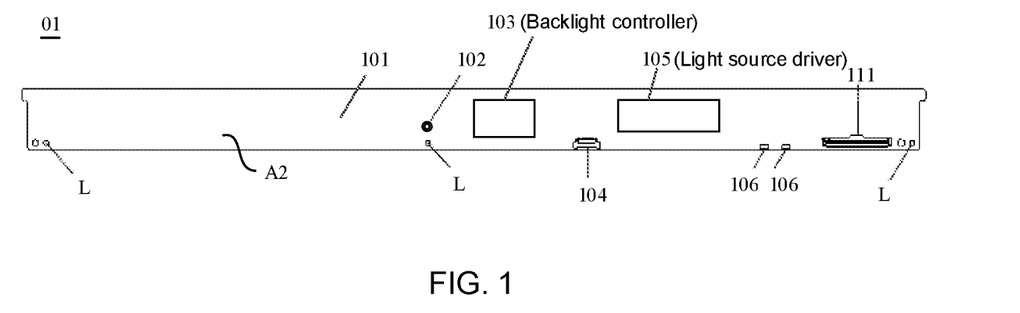
FIG. 1 is a structural diagram of a backlight driving board, in accordance with some embodiments.

As shown in FIG. 1, some embodiments of the present disclosure provide the backlight driving board 01. The backlight driving board 01 includes a main circuit board 101, the photosensitive device 102, a backlight controller 103 and a first port 104.

The photosensitive device 102 is disposed on the main circuit board 101. The photosensitive device 102 is configured to sense the brightness and the color temperature of the light source 202 in real time, and output brightness data and color temperature data.

The backlight controller 103 is disposed on the main circuit board 101, and is coupled to the photosensitive device 102. The backlight controller 103 is configured to receive the brightness data and adjust a light-emitting brightness of the light source 202 according to the brightness data.

The first port 104 is disposed on the main circuit board 101, and is coupled to the photosensitive device 102. The first port 104 is configured to be coupled to the system board 302, receive the color temperature data, and transmit the color temperature data to the system board 302, such that the system board 302 adjusts a color temperature of a picture displayed by the display panel 301 according to the color temperature data.

The backlight driving board 01 provided by the embodiments of present disclosure is configured to drive the light source 202 in the backlight module 02 to emit light. The backlight driving board 01 includes the photosensitive device 102, the backlight controller 103 and the first port 104. The photosensitive device 102 is configured to sense the brightness and the color temperature of the light source 202 in real time, output the brightness data and the color temperature data; the photosensitive device 102 transmits the brightness data to the backlight controller 103, and transmits the color temperature data to the first port 104 and then to the system board 302. In this way, the backlight controller 103 is capable of adjusting the light-emitting brightness of the light source 202 according to the brightness data, and the system board 302 is capable of adjusting the color temperature of the picture displayed by the display panel 301 according to the color temperature data. Therefore, the brightness of the light source 202 of the backlight module 02 may be adjusted in real time, and the color temperature of the picture displayed by the display panel 301 of the display apparatus 03 may also be adjusted in real time. As such, it may be possible to solve a problem that the brightness and the color temperature of the light source 202 of the display apparatus 03 are attenuated after long-term use and cannot be adjusted in time according to feedback, and prevent such problem from affecting a display effect of the display apparatus 03. In addition, it may also be possible to ensure an accuracy of the brightness of the light emitted by the light source 202 and an accuracy of the color temperature of the picture displayed by the display panel 301 after the display apparatus 03 has been used for a long time, and thus improve the display effect of the display apparatus 03.

There are two ways to arrange the photosensitive device 102 on the main circuit board 101, which are described below.

Figure 2:
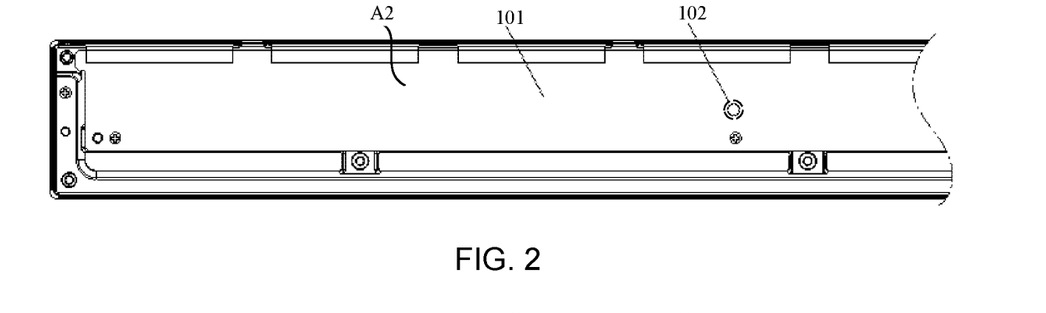
FIG. 2 is an enlarged structural diagram of a backlight driving board, in accordance with some embodiments.
Figure 3:
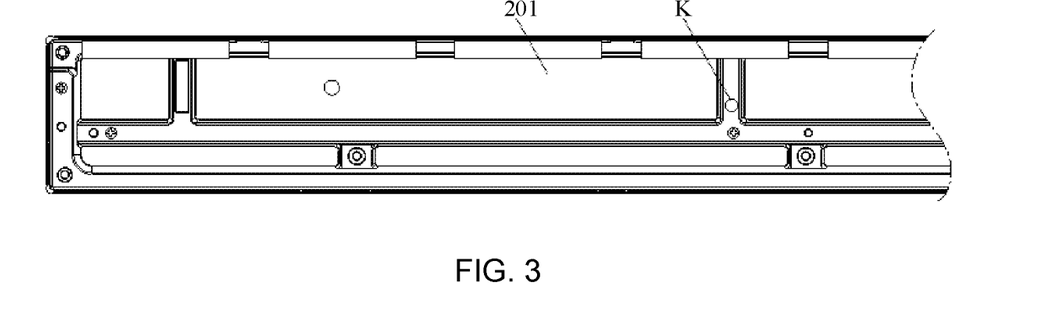
FIG. 3 is a structural diagram of a backplane of a backlight module, in accordance with some embodiments.

In some embodiments, as shown in FIGS. 1, 2 and 4, the photosensitive device 102 is integrated on the main circuit board 101.

For example, the main circuit board 101 is a printed circuit board (PCB). The photosensitive device 102 is integrated on the main circuit board 101 together with the backlight controller 103, the first port 104, and other components of the backlight driving board 01. The main circuit board 101 is provided with interconnection lines for coupling the components. The photosensitive device 102 is coupled to the backlight controller 103 through an interconnection line, so as to realize transmission of the brightness data. The photosensitive device 102 is further coupled to the first port 104 through an interconnection line, so as to realize transmission of the color temperature data.

The way of directly integrating the photosensitive device 102 on the main circuit board 101 has such advantages as high integration and that a volume of the backlight driving board 01 may be reduced. In addition, the photosensitive device 102 transmits data to the backlight controller 103 and the first port 104 directly through the interconnection lines, which ensures a high transmission rate.

In some embodiments, as shown in FIGS. 1, 2, 4 and 5, the main circuit board 101 includes a first main surface A1 and a second main surface A2 that are opposite to each other. The first main surface A1 is configured to be proximate to the light source 202. The photosensitive device 102 is disposed on the first main surface A1 of the main circuit board 101. Herein, in the FIGS. 1 and 2, the photosensitive device 102, disposed on the first main surface A1 (not indicated in FIGS. 1 and 2), is indicated by the dotted circle.

For example, as shown in FIG. 4, in a case where the backlight driving board 01 is applied to the backlight module 02, the main circuit board 101 is disposed on a side of the backplane 201; the first main surface A1 of the main circuit board 101 is closer to the backplane 201 than the second main surface A2 of the main circuit board 101; the light source 202 is disposed on the other side of the backplane 201; and the photosensitive device 102 is disposed on the first main surface A1 of the main circuit board 101 that is proximate to the light source 202, so as to make it easier for the photosensitive device 102 to sense the brightness and the color temperature of the light source 202.

In some examples, as shown in FIGS. 1 and 5, the backlight controller 103 and the first port 104 are disposed on the second main surface A2. In this way, it may be easier to couple the first port 104 to the system board 302 through a data transmission line; moreover, the backlight controller 103 may not occupy a space of the first main surface A1 of the main circuit board 101, which makes it possible for the main circuit board 101 to be tightly attached to the side of the backplane 201.

Figure 6:
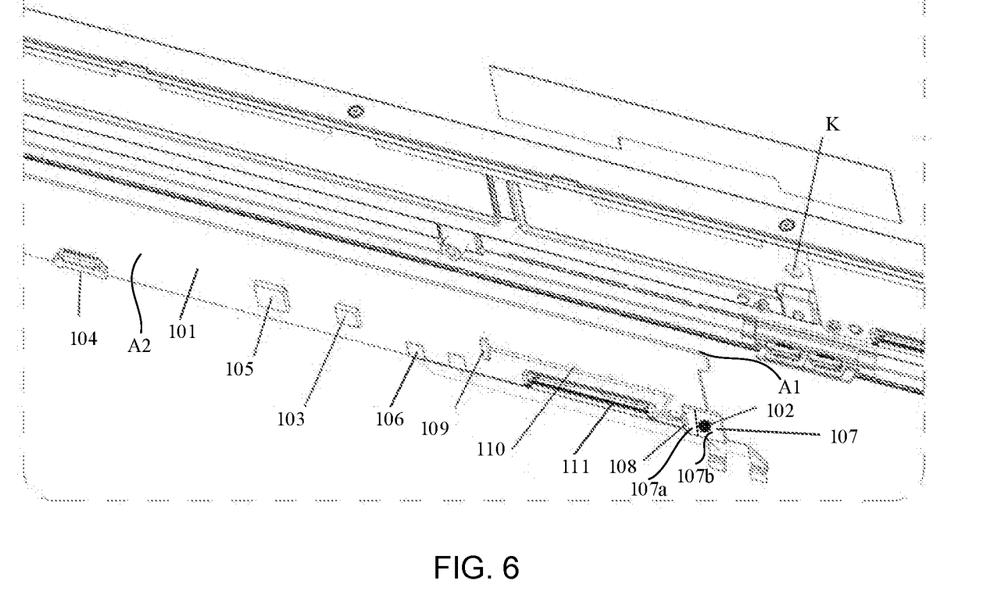
FIG. 6 is an enlarged view of the region BB of the backlight module shown in FIG. 5.

In some other embodiments, as shown in FIGS. 5 and 6, the backlight driving board 01 further includes an auxiliary circuit board 107. The photosensitive device 102 is disposed on the main circuit board 101 through the auxiliary circuit board 107.

In the above embodiments, data connection is formed between the auxiliary circuit board 107 and the main circuit board 101 to enable data transmission. For example, the photosensitive device 102 is integrated on the auxiliary circuit board 107, and the photosensitive device 102 and the auxiliary circuit board 107 form a whole printed circuit board assembly (PCBA), so that the photosensitive device 102 is disposed on the main circuit board 101 through the auxiliary circuit board 107.

In some examples, the auxiliary circuit board 107 is fixed on the main circuit board 101 by soldering or bonding.

In a case where the photosensitive device 102 is disposed on the main circuit board 101 through the auxiliary circuit board 107, the PCBA formed by the photosensitive device 102 and the auxiliary circuit board 107 has high flexibility, and positions of the photosensitive device 102 and the auxiliary circuit board 107 may be determined according to needs.

Based on the case where the photosensitive device 102 is integrated on the auxiliary circuit board 107 as described above, in some embodiments, as shown in FIGS. 5 and 6, the main circuit board 101 includes a first main surface A1 and a second main surface A2 that are opposite to each other, and the first main surface A1 is configured to be proximate to the light source 202.

As shown in FIGS. 5 and 6, the auxiliary circuit board 107 includes a fixed portion 107*a* and an extending portion 107*b*. The fixed portion 107*a* is fixed to the second main surface A2 of the main circuit board 101, and the extending portion 107*b* extends beyond an edge of the second main surface A2 of the main circuit board 101. The photosensitive device 102 is disposed on a side, proximate to a plane where the first main surface A1 of the main circuit board 101 is located, of the extending portion 107*b* of the auxiliary circuit board 107.

For example, as shown in FIG. 6, the auxiliary circuit board 107 is disposed on the second main surface A2 of the main circuit board 101, and the photosensitive device 102 is disposed on the auxiliary circuit board 107. In the case where the backlight driving board 01 is applied to the backlight module 02, in the backlight module 02, the backlight driving board 01 is disposed on the side of the backplane 201 of the backlight module 02 away from the light source 202; the first main surface A1 of the backlight driving board 01 is proximate to the backplane 201; the photosensitive device 102 is disposed on the main circuit board 101 through the auxiliary circuit board 107, and is located on the side, proximate to the plane where the first main surface A1 of the first main circuit board 101 is located, of the extending portion 107*b* of the auxiliary circuit board 107. A position of the photosensitive device 102 corresponds to a position of the opening K in the backplane 201, so as to facilitate sensing of the light source 202 by the photosensitive device 102.

In some embodiments, as shown in FIG. 6, the backlight driving board 01 further includes a second port 108 and a third port 109. The second port 108 is disposed on the auxiliary circuit board 107, and the photosensitive device 102 is coupled to the second port 108. The third port 109 is disposed on the main circuit board 101; the third port 109 is coupled to the second port 108, and is further coupled to the backlight controller 103 and the first port 104.

Data transmission between the main circuit board 101 and the auxiliary circuit board 107 is realized through the second port 108 and the third port 109, thereby realizing transmissions of the brightness data and the color temperature data output by the photosensitive device 102 to the backlight controller 103 and the first port 104, respectively.

For example, the photosensitive device 102 is coupled to the second port 108 through an interconnection line disposed on the auxiliary circuit board 107, thereby realizing the transmissions of the sensed brightness data and the color temperature data of the light source to the second port 108.

The third port 109 is coupled to the backlight controller 103 through an interconnection line disposed on the main circuit board 101, thereby realizing the transmission of the brightness data received from the photosensitive device 102 to the backlight controller 103. The third port 109 is further coupled to the first port 104 through an interconnection line disposed on the main circuit board 101, thereby realizing the transmission of the color temperature data received from the photosensitive device 102 to the first port 104.

In some embodiments, as shown in FIG. 6, the backlight driving board 01 further includes a terminal line 110. The second port 108 is coupled to the third port 109 through the terminal line 110.

The terminal line 110 is a data transmission line. Two ends of the terminal line 110 have plugs corresponding to the second port 108 and the third port 109. By inserting the plugs into the second port 108 and the third port 109, it may be possible to realize data transmission. For example, the terminal line 110 is fixed on the main circuit board 101 by bonding.

Figure 10:
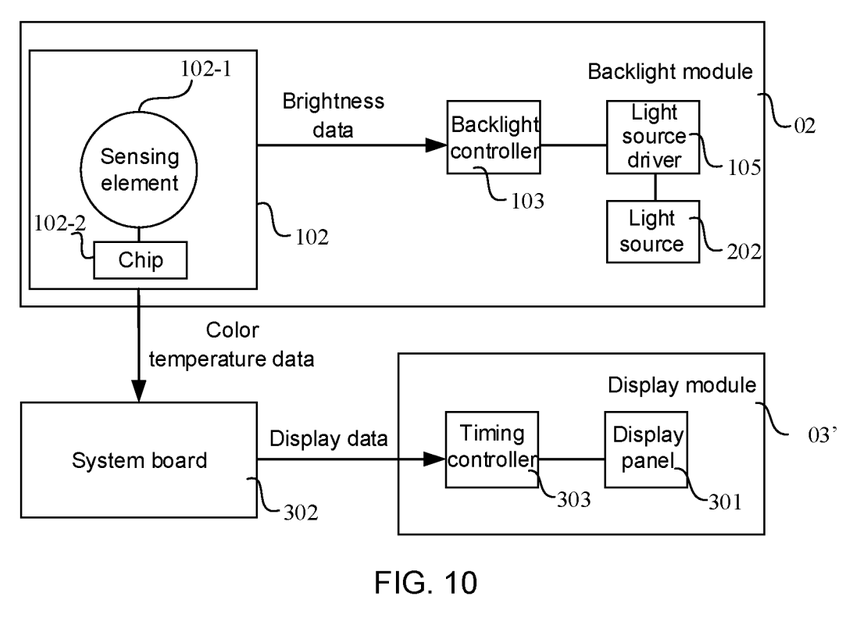
FIG. 10 is a frame diagram of a method for adjusting a brightness and color temperature of a display apparatus, in accordance with some embodiments.

In some embodiments, the photosensitive device 102 is an ambient light sensor. For example, as shown in FIG. 10, the photosensitive device 102 includes a sensing element 102-1 and a chip 102-2. The sensing element 102-1 is configured to sense a light-emitting state of the light source 202 in real time, and output sensing data. The chip 102-2 is coupled to the sensing element, and is configured to process the sensing data, and output the brightness data and the color temperature data.

In some examples, the chip is an integrated circuit (IC), a microcircuit or an application specific integrated circuit (ASIC). For example, the sensing element is configured to sense red-green-blue (RGB) data of the light emitted by the light source 202 in real time, and transmit the RGB data to the chip; the chip processes the RGB data to obtain the brightness and the color temperature of the light source 202, and outputs the brightness data and the color temperature data.

Figure 7:
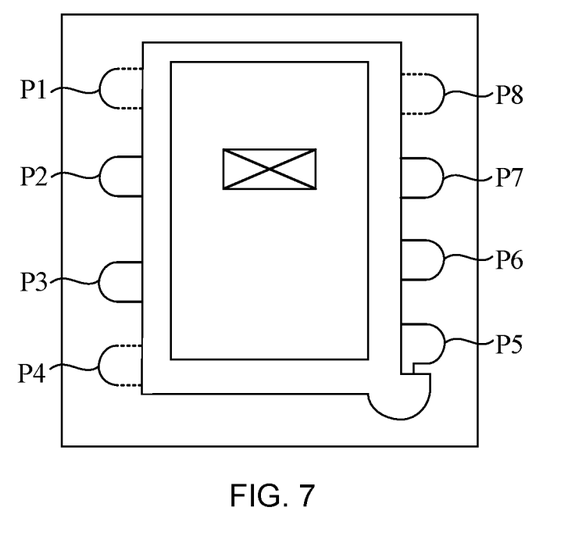
FIG. 7 is a structural diagram of pins of a photosensitive device, in accordance with some embodiments.
Figure 8:
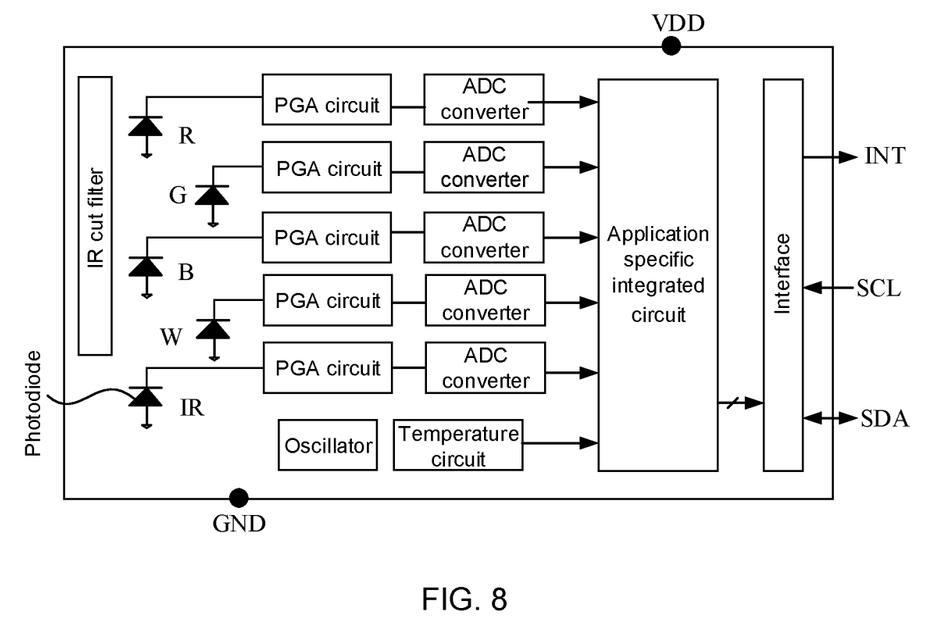
FIG. 8 is an internal logic operation diagram of a photosensitive device, in accordance with some embodiments.

In some examples, as shown in FIG. 7, the photosensitive device 102 has a plurality of pins, and a way of integrating the photosensitive device 102 on the main circuit board 101 or the auxiliary circuit board 107 is as follows: there are corresponding pads on the main circuit board 101 or on the auxiliary circuit board 107, and the plurality of pins of the photosensitive device 102 are soldered to the corresponding pads, so as to integrate the photosensitive device 102 on the main circuit board 101 or the auxiliary circuit board 107. For example, the photosensitive device 102 has eight pins, among which a first pin P1 is defined as idle, a second pin P2 is configured to receive a power supply (VDD, as shown in FIG. 8) signal to provide power required for operation of the photosensitive device 102, a third pin P3 is grounded (GND, as shown in FIG. 8), a fourth pin P4 is defined as idle, a fifth pin P5 is configured to receive a serial clock (SCL, as shown in FIG. 8) signal, a sixth pin P6 is configured to receive a serial data (SDA, as shown in FIG. 8) signal, a seventh pin P7 is configured to receive an interrupt (INT, as shown in FIG. 8) signal, and an eighth pin P8 is defined as idle. The pins defined as idle are only used for soldering, so as to integrate the photosensitive device 102 on the main circuit board 101 or the auxiliary circuit board 107, and are not used for data transmission.

As an example, FIG. 8 is an internal logic operation diagram of the photosensitive device 102. The sensing element of the photosensitive device 102 senses the light-emitting state of the light source 202 in real time. The sensing element includes an array of R (red), G (green), B (blue), W (white), and IR (infrared) photodiodes, programmable gain amplifier circuits (PGA circuits) correspondingly coupled to the photodiodes, analog-to-digital converters (ADC converters) correspondingly coupled to the PGA circuits, an oscillator, a temperature circuit, and other circuits.

During a sensing process, the light emitted by the light source of the backlight module has a wide wavelength band, for example, from 300 nm to 1100 nm, which includes an infrared waveband. However, the R, G, B and W photodiodes of the sensing element are invalid in sensing of infrared light. An IR cut filter needs to be provided on a photosensitive side of the R, G, B and W photodiodes to filter the light of the light source, so as to filter out the infrared waveband. Then, when the R, G, B, W and IR photodiodes are irradiated by the light, a photocurrent will be generated. After being amplified by the PGA circuits, the photocurrent is input to the ADC converters. The ADC converters convert the photocurrent into 16 bytes. After a single conversion cycle, the sensing element transmits the obtained sensing data to an application specific integrated circuit (ASIC), i.e., the chip. The chip processes the photocurrent to obtain the brightness data and the color temperature data, and output the brightness data and the color temperature data through the ports.

In some embodiments, as shown in FIGS. 1 and 6, the backlight controller 103 is configured to output a brightness adjustment signal according to the brightness data. The backlight driving board 01 further includes a light source driver 105 and a fourth port 106 that are disposed on the main circuit board 101. The light source driver 105 is coupled to the backlight controller 103. The light source driver 105 is configured to receive the brightness adjustment signal, and adjust the light-emitting brightness of the light source 202 according to the brightness adjustment signal. The fourth port 106 is configured to couple the light source driver 105 to the light source 202.

In the above embodiments, the light source driver 105 is coupled to the backlight controller 103, and is further coupled to the light source 202 through the fourth port 106. For example, the light source driver 105 is coupled to the backlight controller 103 and the fourth port 106 through interconnection lines disposed on the main circuit board 101. The light source driver 105 adjusts the light-emitting brightness of the light source 202 under the control of the brightness adjustment signal output by the backlight controller 103. For example, the backlight controller 103 adjusts the light-emitting brightness of the light source 202 according to the brightness data in the following way: the backlight controller 103 outputs a pulse width modulation (PWM) signal to the light source driver 105 according to the brightness data to control a magnitude of a voltage driving signal output by the light source driver 105, so as to adjust the light-emitting brightness of the light source 202.

As a possible arrangement, as shown in FIG. 1, the main circuit board 101 further has a plurality of positioning holes L. The plurality of positioning holes L are configured to match a plurality of screws, and the main circuit board 101 is fixed on the side of the backplane 201 away from the light source 202 by the screws.

As shown in FIG. 1, the backlight driving board 01 further includes a fifth port 111 disposed on the main circuit board 101. The fifth port 111 is configured to be coupled to the display panel 301, so as to realize data transmission between the backlight driving board 01 and the display panel 301. For example, the fifth port 111 is a low-voltage differential signaling (LVDS) interface; and signals output by the fifth port 111 include power supply signals and display signals. The power supply signals are used for driving liquid crystals in the display panel 301 to turn over to perform display, and the display signals are used for controlling the display panel 301 to display pictures.

In some embodiments, as shown in FIG. 9B, the system board 302 of the display apparatus 03 is configured to adjust display data required for the display panel 301 to display the picture according to the color temperature data, and output adjusted display data. The system board 302 is coupled to the display panel 301 through the timing controller 303. The timing controller 303 is configured to control the display panel 301 to display the picture according to the adjusted display data, such that a color temperature of the picture displayed by the display panel 301 to meets a preset requirement.

In the above embodiments, as shown in FIG. 9B, for example, the timing controller 303 is coupled to the system board 302 to receive the adjusted display data output by the system board 302; the timing controller 303 generates operation timings for driving the gate driving circuit 306 and the source driving circuit 305, so that the gate driving circuit 306 outputs the scanning signals, and the source driving circuit 305 outputs the data signals to drive the display panel 301 to perform display, so that the color temperature of the picture displayed by the display panel 301 meets the preset requirement. The preset requirement refers to a color temperature of the picture displayed by the display panel 301 in a case where the brightness and the color temperature of the light source 202 of the backlight module 02 are not attenuated.

Figure 11:
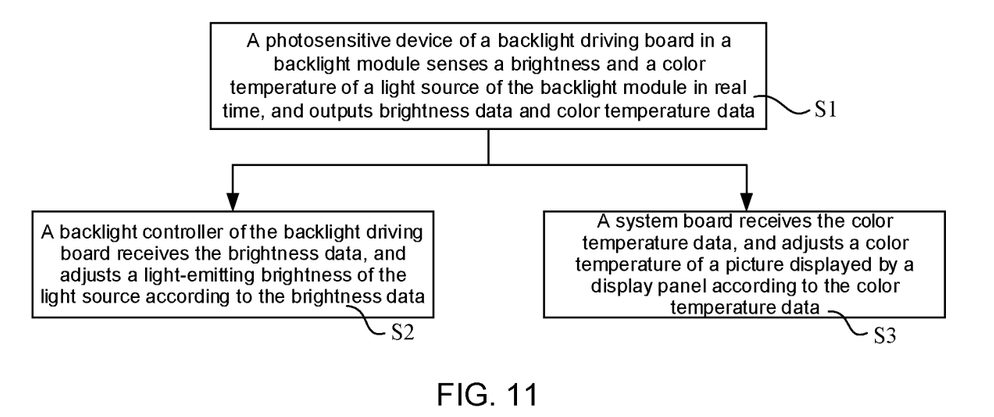
FIG. 11 is a flowchart of a method for adjusting a brightness and a color temperature of a display apparatus, in accordance with some embodiments.

Some embodiments of the present disclosure provide a method for adjusting a brightness and a color temperature of a display apparatus. As shown in FIGS. 10 and 11, the adjusting method includes steps 1 to 3 (S1 to S3).

In S1, a photosensitive device 102 of a backlight driving board 01 in a backlight module 02 senses a brightness and a color temperature of a light source 202 of the backlight module 02 in real time, and outputs brightness data and color temperature data.

In S2, a backlight controller 103 of the backlight driving board 01 receives the brightness data, and adjusts a light-emitting brightness of the light source 202 according to the brightness data.

In S3, a system board 302 receives the color temperature data, and adjusts a color temperature of a picture displayed by a display panel 301 according to the color temperature data.

Herein, S2 and S3 are performed simultaneously; or, S2 is performed before S3; or, S3 is performed before S2. Embodiments of the present disclosure do not limit an order of S2 and S3.

The method for adjusting the brightness and the color temperature of the display apparatus 03 provided by embodiments of the present disclosure is applied to the display apparatus 03 shown in FIGS. 9A and 9B. The photosensitive device 102 of the backlight module 02 senses the brightness and the color temperature of the light source 202 in real time, outputs the brightness data and the color temperature data, transmits the brightness data to the backlight controller 103, and transmits the color temperature data to the system board 302, so that the backlight controller 103 adjusts the light-emitting brightness of the light source 202 according to the brightness data, and the system board 302 adjusts the color temperature of the picture displayed by the display panel 301 according to the color temperature data. In this way, the brightness of the light source 202 of the backlight module 02 may be adjusted in real time, and the color temperature of the picture displayed by the display panel 301 of the display apparatus 03 may also be adjusted in real time. As such, it may be possible to solve the problem that the brightness and the color temperature of the light source 202 of the display apparatus 03 are attenuated after long-term use and cannot be adjusted in time according to feedback, and prevent such problem from affecting the display effect of the display apparatus 03. In addition, it may also be possible to ensure the accuracy of the brightness of the light emitted by the light source 202 and the accuracy of the color temperature of the picture displayed by the display panel 301 after the display apparatus 03 has been used for a long time, and thus improve the display effect of the display apparatus 03.

Figure 12:
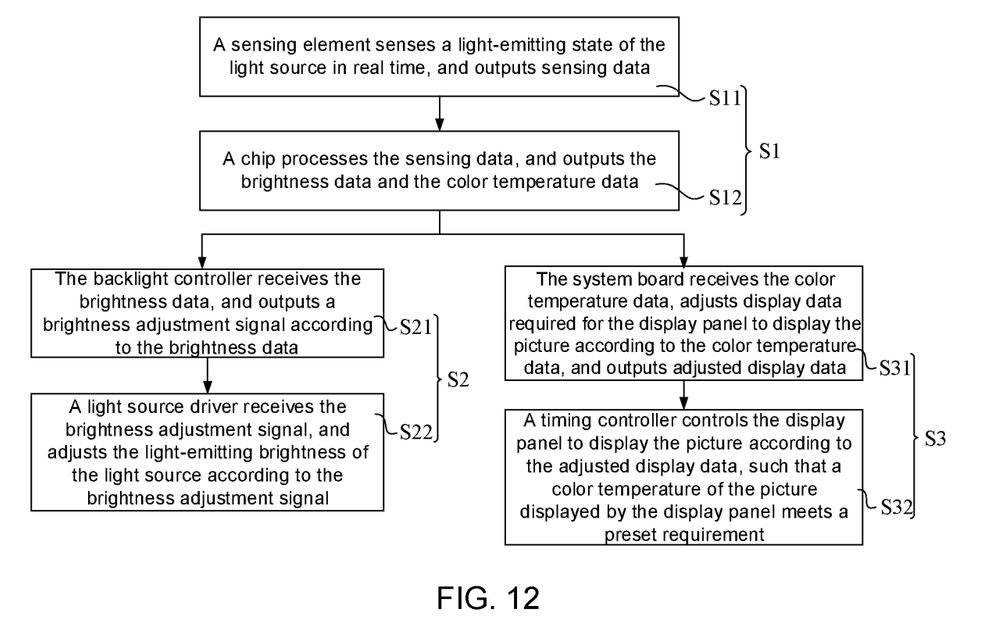
FIG. 12 is a flowchart of another method for adjusting a brightness and a color temperature of a display apparatus, in accordance with some embodiments.

In some embodiments, in a case where the backlight driving board 01 further includes a light source driver 105, as shown in FIG. 12, S2, in which step the backlight controller 103 of the backlight driving board 01 receives the brightness data and adjusts the light-emitting brightness of the light source 202 according to the brightness data, includes steps 21 and 22 (S21 and S22).

In S21, the backlight controller 103 receives the brightness data, and outputs a brightness adjustment signal according to the brightness data.

In S22, the light source driver 105 receives the brightness adjustment signal, and adjusts the light-emitting brightness of the light source 202 according to the brightness adjustment signal.

For example, the backlight controller 103 outputs a pulse width modulation (PWM) signal according to the brightness data; the light source driver 105 receives the PWM signal, and adjusts a magnitude of a voltage driving signal outputted by the light source driver 105, so as to adjust the light-emitting brightness of the light source 202.

In some embodiments, in a case where the display apparatus 03 further includes a timing controller 303, as shown in FIG. 12, S3, in which step the system board 302 receives the color temperature data and adjusts the color temperature of the picture displayed by the display panel 301 according to the color temperature data, includes steps 31 and 32 (S31 and S32).

In S31, the system board 302 receives the color temperature data, adjusts the display data required for the display panel 301 to display the picture according to the color temperature data, and outputs adjusted display data.

In S32, the timing controller 303 controls the display panel 301 to display the picture according to the adjusted display data, such that a color temperature of the picture displayed by the display panel 301 meets a preset requirement.

In some examples, in a case where the display apparatus 03 further includes a gate driving circuit 306 and a source driving circuit, the timing controller 303 generates operation timings for driving the gate driving circuit 306 and the source driving circuit according to the adjusted display data, and then the gate driving circuit 306 outputs scanning signals, and the source driving circuit outputs data signals, so as to drive the display panel 301 to perform display, so that the color temperature of the picture displayed by the display panel 301 meets the preset requirement.

In some embodiments, in a case where the photosensitive device 102 includes a sensing element and a chip, as shown in FIG. 12, S1, in which step the photosensitive device 102 of the backlight driving board 01 in the backlight module 02 senses the brightness and the color temperature of the light source 202 of the backlight module 02 in real time and outputs the brightness data and the color temperature data, includes steps 11 and 12 (S11 and S12).

In S11, the sensing element senses a light-emitting state of the light source 202 in real time, and outputs sensing data.

For example, the sensing element senses red-green-blue (RGB) data of the light emitted by the light source 202 in real time, and outputs the RGB data as the sensing data.

In S12, the chip processes the sensing data, and outputs the brightness data and the color temperature data.

For example, the chip calculates the brightness data and color temperature data of the light source 202 according to the received RGB data.

Figure 13:
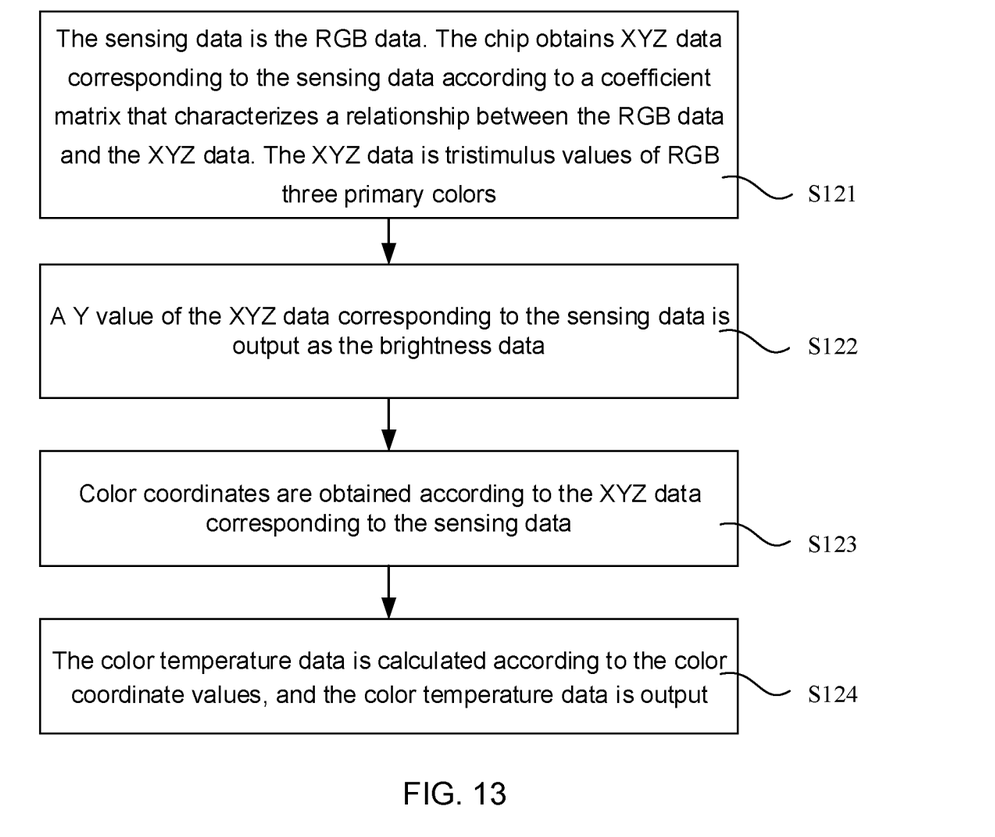
FIG. 13 is a flowchart of still another method for adjusting a brightness and a color temperature of a display apparatus, in accordance with some embodiments.

In some embodiments, as shown in FIG. 13, S12, in which step the chip processes the sensing data and outputs the brightness data and the color temperature data, includes steps 121 to 124 (S121 to S124).

In S121, the sensing data is the RGB data, and the chip obtains XYZ data corresponding to the sensing data according to a coefficient matrix that characterizes a relationship between the RGB data and the XYZ data. The XYZ data is tristimulus values of RGB three primary colors.

A CIE XYZ system, which is based on a CIE RGB system, selects three ideal primary colors to replace three actual primary colors so as to change chromaticity coordinates in the CIE RGB system to positive values by using a mathematical method. There is a corresponding relationship between the XYZ data and the RGB data, and XYZ is a linear change of RGB. Each color may be represented as a mixture of XYZ, and a changed color space is independent of an apparatus.

For example, the coefficient matrix that characterizes the relationship between the RGB data and the XYZ data is $$\begin{bmatrix} C_{11} & C_{12} & C_{13} \\ C_{21} & C_{22} & C_{23} \\ C_{31} & C_{32} & C_{33} \end{bmatrix}.$$

According to the coefficient matrix, through a formula (1), the RGB data is converted into the XYZ data.

$$\begin{bmatrix} X \\ Y \\ Z \end{bmatrix} = \begin{bmatrix} C_{11} & C_{12} & C_{13} \\ C_{21} & C_{22} & C_{23} \\ C_{31} & C_{32} & C_{33} \end{bmatrix} \cdot \begin{bmatrix} R \\ G \\ B \end{bmatrix} \qquad (1)$$

In S122, a Y value in the XYZ data corresponding to the sensing data is output as the brightness data.

In the CIE XYZ system, the Y value in the XYZ data is defined as brightness.

In S123, color coordinates are obtained according to the XYZ data corresponding to the sensing data.

According to the XYZ data, optical data color coordinates (x, y) are obtained through a formula (2).

$$x = \frac{X}{X+Y+Z}; \, y = \frac{Y}{X+Y+Z} \qquad (2)$$

In S124, the color temperature data is calculated according to the color coordinates, and the color temperature data is output.

The color temperature (CCT) data of the light source 202 is obtained according to the optical data color coordinates (x, y) through a formula (3).

$$CCT = -449 \cdot \left(\frac{x-0.332}{y-0.1858}\right)^3 + \quad (3)$$
$$3525 \cdot \left(\frac{x-0.332}{y-0.1858}\right)^2 - 6823.3 \cdot \frac{x-0.332}{y-0.1858} + 5520.33$$

In some embodiments, before S121, the method further includes a step of establishing the coefficient matrix that characterizes the relationship between the RGB data and the XYZ data. The step includes the following steps.

Three light sources (a light source 1, a light source 2 and a light source 3) are provided. The three light sources, as standard light sources, are sequentially installed in the backlight module 02. The selected three light sources and the light source 202 to be measured in subsequent steps belong to a same type of light source, so that the coefficient matrix obtained according to the three standard light sources can be used as a basis for sensing the brightness and the color temperature of the light source to be measured.

The sensing data (the RGB data) of each of the three standard light sources is independently sensed by using the photosensitive device 102, and the XYZ data of each of the three standard light sources is obtained. The RGB data corresponding to the three light sources forms an RGB matrix $[R_1, G_1, B_1; R_2, G_2, B_2; R_3, G_3, B_3]$, and the XYZ data corresponding to the three light sources forms an XYZ matrix $[X_1, Y_1, Z_1; X_2, Y_2, Z_2; X_3, Y_3, Z_3]$, where the subscripts 1, 2, and 3 indicate that the values are obtained from the light source 1, the light source 2 and the light source 3, respectively. A calculation formula (4) of the coefficient matrix C is as follows:

$$\begin{bmatrix} C_{11} & C_{12} & C_{13} \\ C_{21} & C_{22} & C_{23} \\ C_{31} & C_{32} & C_{33} \end{bmatrix} = \begin{bmatrix} X_1 & X_2 & X_3 \\ Y_1 & Y_2 & Y_3 \\ Z_1 & Z_2 & Z_3 \end{bmatrix} \cdot \begin{bmatrix} R_1 & R_2 & R_3 \\ G_1 & G_2 & G_3 \\ B_1 & B_2 & B_3 \end{bmatrix}^{-1} \quad (4)$$

The obtained coefficient matrix is stored in the chip as the basis for converting the RGB data that is sensed by the photosensitive device 102 in real time into XYZ data, and then into the brightness data and the color temperature data in a subsequent process.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A backlight driving board, comprising:
a main circuit board;
a photosensitive device disposed on the main circuit board, the photosensitive device being configured to sense a brightness and a color temperature of a light source, and output brightness data and color temperature data;
a backlight controller disposed on the main circuit board, the backlight controller being coupled to the photosensitive device, and configured to receive the brightness data and adjust a light-emitting brightness of the light source according to the brightness data;
a first port disposed on the main circuit board, the first port being coupled to the photosensitive device, and configured to be coupled to a system board, receive the color temperature data, and transmit the color temperature data to the system board, such that the system board adjusts a color temperature of a picture displayed by a display panel according to the color temperature data; and
an auxiliary circuit board, the auxiliary circuit board and the main circuit board being capable of transmitting data to each other, and the photosensitive device being disposed on the main circuit board through the auxiliary circuit board.

2. The backlight driving board according to claim 1, wherein:
the main circuit board includes a first main surface and a second main surface opposite to each other; the first main surface is configured to be proximate to the light source;
the auxiliary circuit board includes a fixed portion and an extending portion; the fixed portion is fixed to the second main surface of the main circuit board, and the extending portion extends beyond an edge of the second main surface of the main circuit board; and
the photosensitive device is disposed on a side, proximate to a plane where the first main surface of the main circuit board is located, of the extending portion of the auxiliary circuit board.

3. The backlight driving board according to claim 1, further comprising:
a second port disposed on the auxiliary circuit board, the photosensitive device being coupled to the second port; and
a third port disposed on the main circuit board, the third port being coupled to the second port, the backlight controller and the first port.

4. The backlight driving board according to claim 3, further comprising:
a terminal line, the second port being coupled to the third port through the terminal line.

5. The backlight driving board according to claim 1, wherein the photosensitive device includes:
a sensing element configured to sense a light-emitting state of the light source, and output sensing data; and
a chip coupled to the sensing element, the chip being configured to process the sensing data, and output the brightness data and the color temperature data.

6. The backlight driving board according to claim 1, wherein: the backlight controller is configured to output a brightness adjustment signal according to the brightness data; and
the backlight driving board further comprises:
a light source driver disposed on the main circuit board, the light source driver being coupled to the backlight controller, and the light source driver being configured to receive the brightness adjustment signal, and adjust the light-emitting brightness of the light source according to the brightness adjustment signal; and
a fourth port disposed on the main circuit board, the fourth port being configured to couple the light source driver to the light source.

7. The backlight driving board according to claim 1, wherein the photosensitive device is an ambient light sensor.

8. A backlight module, comprising:
a backplane;
the light source disposed on a side of the backplane; and the backlight driving board according to claim 1, the backlight driving board being disposed on a side of the backplane away from the light source, wherein:

the backplane has an opening at a position corresponding to the photosensitive device of the backlight driving board; and a sensing end of the photosensitive device extends into the opening, so as to sense the brightness and the color temperature of the light source.

9. A display apparatus, comprising:

the backlight module according to claim 8;

the display panel disposed on a light-exit surface of the backlight module; and the system board, the system board being coupled to the first port of the backlight driving board in the backlight module, and the display panel, and the system board being configured to receive the color temperature data from the first port, and adjust the color temperature of the picture displayed by the display panel according to the color temperature data.

10. The display apparatus according to claim 9, wherein: the system board is configured to adjust display data required for the display panel to display the picture according to the color temperature data, and output adjusted display data; and the display apparatus further comprises:

a timing controller, the system board being coupled to the display panel through the timing controller, and the timing controller being configured to control the display panel to display the picture according to the adjusted display data.

11. A backlight module, comprising:

a backplane;

the light source disposed on a side of the backplane; and a backlight driving board, the backlight driving board being disposed on a side of the backplane away from the light source, wherein:

the backlight driving board includes:

a main circuit board;

a photosensitive device disposed on the main circuit board, the photosensitive device being configured to sense a brightness and a color temperature of a light source, and output brightness data and color temperature data;

a backlight controller disposed on the main circuit board, the backlight controller being coupled to the photosensitive device, and configured to receive the brightness data and adjust a light-emitting brightness of the light source according to the brightness data; and a first port disposed on the main circuit board, the first port being coupled to the photosensitive device, and configured to be coupled to a system board, receive the color temperature data, and transmit the color temperature data to the system board, such that the system board adjusts a color temperature of a picture displayed by a display panel according to the color temperature data; and the backplane has an opening at a position corresponding to the photosensitive device of the backlight driving board, and a sensing end of the photosensitive device extends into the opening, so as to sense the brightness and the color temperature of the light source.

12. A display apparatus, comprising:

the backlight module according to claim 11;

the display panel disposed on a light-exit surface of the backlight module; and the system board, the system board being coupled to the first port of the backlight driving board in the backlight module, and the display panel, and the system board being configured to receive the color temperature data from the first port, and adjust the color temperature of the picture displayed by the display panel according to the color temperature data.

13. The display apparatus according to claim 12, wherein: the system board is configured to adjust display data required for the display panel to display the picture according to the color temperature data, and output adjusted display data; and the display apparatus further comprises:

a timing controller, the system board being coupled to the display panel through the timing controller, and the timing controller being configured to control the display panel to display the picture according to the adjusted display data.

14. A method for adjusting the brightness and the color temperature of the display apparatus according to claim 12, the method comprising:

sensing, by the photosensitive device of the backlight driving board in the backlight module, the brightness and the color temperature of the light source of the backlight module;

outputting, by the photosensitive device, the brightness data and the color temperature data;

receiving, by the backlight controller of the backlight driving board, the brightness data;

adjusting, by the backlight controller, the light-emitting brightness of the light source according to the brightness data;

receiving, by the system board, the color temperature data; and adjusting, by the system board, the color temperature of the picture displayed by the display panel according to the color temperature data.

15. The method according to claim 14, wherein: the backlight driving board further includes a light source driver; and receiving, by the backlight controller of the backlight driving board, the brightness data, and adjusting, by the backlight controller, the light-emitting brightness of the light source according to the brightness data includes:

receiving, by the backlight controller, the brightness data;

outputting, by the backlight controller, a brightness adjustment signal according to the brightness data;

receiving, by the light source driver, the brightness adjustment signal; and adjusting, by the light source driver, the light-emitting brightness of the light source according to the brightness adjustment signal.

16. The method according to claim 14, wherein: the display apparatus further includes a timing controller; and receiving, by the system board, the color temperature data, and adjusting, by the system board, the color temperature of the picture displayed by the display panel according to the color temperature data includes:

receiving, by the system board, the color temperature data;

adjusting, by the system board, display data required for the display panel to display the picture according to the color temperature data;

outputting, by the system board, adjusted display data; and controlling, by the timing controller, the display panel to display the picture according to the adjusted display data.

17. The method according to claim 14, wherein: the photosensitive device includes a sensing element and a chip; and sensing, by the photosensitive device of the backlight driving board in the backlight module, the brightness and the color temperature of the light source of the backlight module, and outputting, by the photosensitive device, the brightness data and the color temperature data includes:

sensing, by the sensing element, a light-emitting state of the light source;

outputting, by the sensing element, sensing data;

processing, by the chip, the sensing data; and outputting, by the chip, the brightness data and the color temperature data.

18. The method according to claim 17, wherein: processing, by the chip, the sensing data, and outputting, by the chip, the brightness data and the color temperature data includes:

obtaining, by the chip, XYZ data corresponding to the sensing data according to a coefficient matrix that characterizes a relationship between red-green-blue (RGB) data and the XYZ data, wherein the sensing data is the RGB data, and the XYZ data is tristimulus values of RGB three primary colors;

outputting, by the chip, a Y value of the XYZ data corresponding to the sensing data as the brightness data;

obtaining, by the chip, color coordinates according to the XYZ data corresponding to the sensing data;

calculating, by the chip, the color temperature data according to the color coordinates; and outputting, by the chip, the color temperature data.

* * * * *